Jan. 15, 1957

J. A. DOREMUS 2,777,950

OSCILLATOR

Filed March 23, 1953

INVENTOR.
John A. Doremus

BY Norman L. Mueller

Atty.

United States Patent Office 2,777,950

Patented Jan. 15, 1957

2,777,950

OSCILLATOR

John A. Doremus, Chicago, Ill., assignor to Motorola, Inc., Chicago, Ill., a corporation of Illinois Application March 23, 1953, Serial No. 343,963

4 Claims. (Cl. 250—36)

This invention relates generally to accurately controlled oscillators, and more particularly to a low frequency oscillator system which includes a transistor unit and a vibrating reed electro-mechanical structure for controlling the frequency thereof.

Accurately controlled low frequency oscillators are required in various different applications such as selective signalling systems and also as tone sources for electrical musical instruments. Electro-mechanical structures including reeds mounted in magnetic fields have been used for accurately controlling the frequency of such oscillators. In such oscillators one or more tubes have been used to provide the oscillating circuit, and the electro-mechanical device and a plurality of other coupling components are required to form a relatively complicated and expensive unit. Further such circuits require relatively large operating voltages which must be maintained within reasonable limits to hold the oscillator frequency stable.

It is therefore an object of the present invention to provide an improved oscillator circuit of extremely simple construction.

A further object of this invention is to provide a low frequency transistor oscillator circuit wherein the frequency is very accurately maintained, A feature of this invention is the provision of a transistor oscillator circuit including a vibrating reed electro-mechanical structure for controlling the frequency thereof. This oscillator requires a minimum of components and will operate at a very low voltage.

Another feature of this invention is the provision of a low frequency oscillator including a point contact transistor having an electro-mechanical vibrating structure connected in the circuit of the base electrode thereof. This circuit will oscillate at the resonant frequency of the electro-mechanical structure at which the impedance is maximum.

A further feature of this invention is the provision of a transistor oscillator circuit including an electro-mechanical vibrating structure coupling the emitter and collector electrodes to provide oscillations at the anti-resonant or low impedance point of the characteristic curve of the electro-mechanical structure.

Further objects, features and the attending advantages of the invention will be apparent from a consideration of the following description when taken in connection with the accompanying drawings in which.

In practicing the invention there is provided an oscillator circuit wherein a transistor is provided for sustaining oscillations. A point contact transistor of the PNP type, having a current gain of more than one may be used. The frequency of the oscillations is controlled by an electro-mechanical vibrating reed structure which has an impedance curve having sharp peaks so that accurate frequency control is provided. In one embodiment the electro-mechanical unit is connected to the base electrode of the transistor to provide oscillations at the resonance point (maximum impedance). In a second embodiment the electro-mechanical device is connected between the emitter and collector electrodes so that oscillations are provided at the anti-resonance point (minimum impedance).

Figure 1:
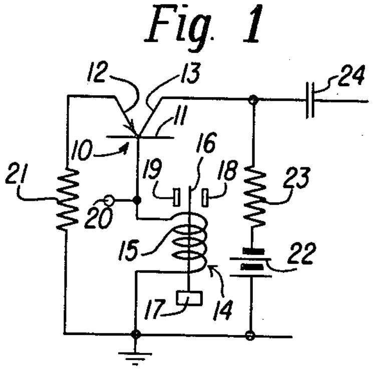
Fig. 1 is a circuit diagram of an oscillator circuit in accordance with the invention.

Referring now to the drawings, in Fig. 1 there is illustrated an oscillator circuit including a transistor 10 of the point contact type, or any type having a current gain greater than one. The transistor 10 includes a base electrode 11, an emitter electrode 12 and a collector electrode 13. The base electrode 11 is connected to ground through the coil 15 of an electro-mechanical device 14. The device 14 includes a reed structure 16 rigidly mounted in a support 17, and having the ends thereof positioned adjacent magnetic poles 18 and 19. The reed 16 is adapted to vibrate with respect to the coil 15 and the poles 18 and 19, and affects the resonant impedance of the coil 15. The emitter electrode 12 is grounded through biasing resistor 21 and the collector electrode 13 is connected to a source of negative potential 22 by resistor 23. Oscillations may be derived from the circuit through condenser 24 which is connected to the collector electrode 13 or from a lead 20 connected to the top of the coil of the electro-mechanical unit.

Figure 2:
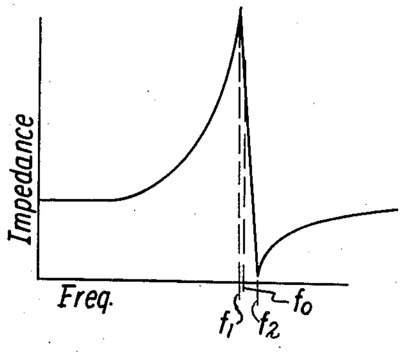
Fig. 2 is the impedance-frequency characteristic curve of the electro-mechanical vibrating structure.

Considering now the operation of the circuit of Fig. 1, oscillations will take place in the circuit at the frequency at which the regenerative action is maximum. This occurs when the impedance of the circuit of the base electrode 11 is maximum. The impedance of the electro-mechanical unit 14 is illustrated by the curve of Fig. 2 and this impedance has a very sharp maximum point at the frequency $F_1$. This frequency is just slightly lower than the natural frequency of vibration of the reed $F_0$. The frequency $F_1$ is called the resonant frequency of the electro-mechanical device. Accordingly, the oscillator of Fig. 1 will oscillate at the frequency $F_1$ at which the impedance of the electro-mechanical device is maximum. This frequency can be accurately controlled by controlling the dimensions of the electro-mechanical device.

Figure 3:
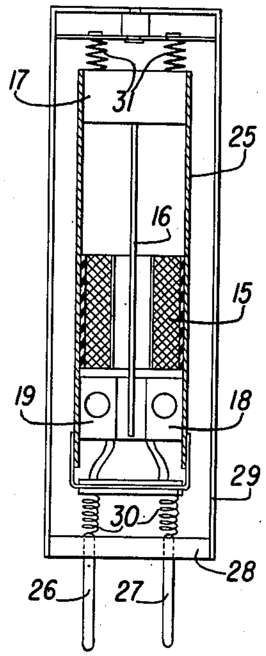
Fig. 3 shows the physical construction of an electro-mechanical unit which may be used in the circuit of Fig. 1.

Reference is now made to Fig. 3 which illustrates the physical details of an electro-mechanical device for use in the oscillator in accordance with the invention. This structure may be generally similar to that disclosed and claimed in copending application of Holzinger et al., Serial No. 179,114, filed August 14, 1950, entitled Electro-Mechanical Device, and assigned to the same assignee as the present invention. In this structure the same reference numerals are applied as in Fig. 1. The base 17 and vibrating reed 16 are made of magnetizable material and the reed is rigidly secured to the base. The reed and base are positioned in a sheet metal inner housing 25 of rectangular configuration with the reed extending along the longitudinal axis of the housing. The housing 25 also includes a permanent magnet structure including the north magnetic pole 18 positioned on one side of the free end of the reed, and the south magnetic pole 19 positioned on the other side. Surrounding the reed 16 and between the base 17 and the poles 18 and 19 is the coil 15. This coil is connected to plug-in contact pins 26 and 27 on the mounting base 28. An outer housing 29 is secured to the mounting base, with the inner housing 25 being supported therein by springs 30 and 31. The springs 30 may also provide electrical connections between the coil 15 and the contact pins 26 and 27.

When an alternating current signal is applied to coil 15, a varying magnetic field is produced around the coil which passes along the reed 16 and either adds to or subtracts from the field produced by the magnetic poles 18 and 19. The reed 16 is positioned so that it normally extends mid-way between the poles, and during one-half cycle of the signal applied to the coil 15 the combined permanent and electrical fields cause the reed to be pulled to one side and on the next half cycle the two fields cause the reed to be pulled to the other side. When the signal applied to coil 15 is of the resonant frequency of vibration of reed 16 $F_0$, reed 16 vibrates at maximum amplitude. This controls the resonant impedance of the coil 15 and causes it to reach a maximum value at the frequency $F_1$ as illustrated in Fig. 2. As previously stated the oscillator of Fig. 1 will, therefore, oscillate at the frequency $F_1$.

Figure 4:
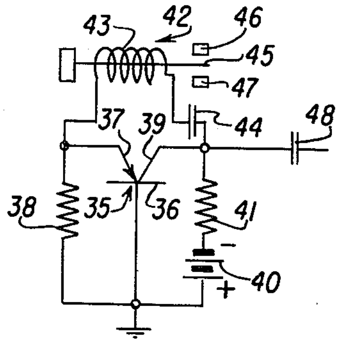
Fig. 4 illustrates a second circuit embodiment in accordance with the invention.

Referring now to Fig. 4, in this figure the transistor 35 has the base electrode 36 thereof connected directly to ground, the emitter electrode 37 is connected through resistor 38 to ground, and the collector electrode 39 is connected to the negative potential source 40 through resistor 41. Feedback is provided from the collector electrode 39 to the emitter electrode 37 through the electro-mechanical device 42 which may be of the same general construction as device 14 of Fig. 1, and as illustrated in Fig. 3. The electro-mechanical device includes coil 43 which is connected in series with condenser 44 between the emitter and collector electrodes. The magnetic reed 45 vibrates within the coil 42 and with respect to magnetic poles 46 and 47 as has been fully explained.

The circuit of Fig. 4 will oscillate when the impedance in the feedback circuit is a minimum. As shown by the characteristic curve of Fig. 2, the effective impedance of the coil of the electro-mechanical unit is a minimum at the frequency $F_2$ which is a slightly higher frequency than the frequency $F_0$ which is the natural frequency of vibration of the reed. The frequency $F_2$ is called the anti-resonant point of the electro-mechanical device. The circuit of Fig. 4 will, therefore, oscillate at a slightly higher frequency than the circuit of Fig. 1 when the same electro-mechanical device is used. The output of the circuit of Fig. 4 may be derived from either the emitter or collector electrodes. In Fig. 4, the output of the oscillator may be derived from the collector electrode 39 through condenser 48.

It is therefore seen from the above that there is provided in accordance with the invention an improved oscillator circuit which is of extremely simple construction. The transistor unit which sustains oscillations requires a minimum of coupling components and operates from a very low potential to thereby conserve power. The precision of the electro-mechanical device will depend upon the accuracy of the frequency required, and by careful construction highly accurate frequency control in the low frequency range can be provided. The coupling of this device may be very simply accomplished so that the over-all circuit requires a very few components and is therefore relatively inexpensive.

Although certain embodiments of the invention have been disclosed which are illustrative thereof, it is obvious that various changes and modifications can be made in the invention within the intended scope of the invention as defined in the appended claims.

I claim:

1. An oscillator circuit which operates at a predetermined frequency including in combination, a point-contact transistor of the PNP type having base, emitter, and collector electrodes, an electro-mechanical device including a magnetic vibrating reed structure and a winding positioned about said reed structure, with said reed structure being of such configuration that said winding has a sharp maximum impedance peak at said predetermined frequency, means connecting said winding between said base electrode of said transistor and a reference potential, and circuit means connected to said emitter and collector electrodes of said transistor for biasing the same, said winding providing feedback for sustaining oscillations in the circuit and providing a direct current path from said base electrode to said reference potential, said electro-mechanical device being the sole frequency selective means in the oscillator circuit and providing feedback for sustaining oscillations only at said predetermined frequency.

2. A low-frequency oscillator circuit including in combination, a transistor having an input electrode, an output electrode and a common electrode; an input circuit connected between said input electrode and a point of reference potential and including biasing means for said input electrode; an output circuit connected between said output electrode and said point of reference potential and including biasing means for said output electrode; an electro-mechanical device having a magnetizable reed mounted for vibration, and having means including an inductive winding for establishing a magnetic field for vibrating said reed, with said winding exhibiting a sharp maximum impedance peak at a frequency related to the natural frequency of vibration of said reed; and means connecting said winding between said common electrode and said point of reference potential to provide a direct current path therebetween and to form a frequency-selective feedback network for feeding energy from said output circuit to said input circuit of appropriate phase to sustain oscillation, said electro-mechanical device being the only frequency selective means in the oscillator circuit, whereby oscillation is sustained at the frequency of said maximum impedance peak of said winding.

3. A low-frequency oscillator circuit including in combination, a transistor having first and second electrodes and a common electrode cooperating therewith, a first circuit connected between said first electrode and a point of reference potential and including biasing means for said first electrode, a second circuit connected between said second electrode and said point of reference potential and including biasing means for said second electrode, an electro-mechanical device having a magnetizable reed mounted for vibration and a single inductive winding for establishing a magnetic field for said reed, with said winding exhibiting a sharp maximum impedance peak at a predetermined frequency related to the natural frequency of vibration of said reed, and means connecting said winding between said common electrode and said point of reference potential, said winding providing a direct current path from said common electrode to said point of reference potential, said electromechanical device being the sole frequency-selective means in the oscillator circuit and feeding energy from said second circuit to said first circuit of appropriate phase to sustain oscillations at said predetermined frequency, whereby oscillations are sustained in said oscillator circuit at the frequency of said maximum impedance peak of said winding.

4. A low-frequency oscillator circuit including in combination, a transistor having an emitter electrode, a collector electrode and a base electrode, a first circuit connected between said emitter electrode and a point of reference potential and including biasing means for said emitter electrode, a second circuit connected between said collector electrode and said point of reference potential and including biasing means for said collector electrode, an electro-mechanical device having a magnetizable reed mounted for vibration and a single inductive winding for establishing a magnetic field for said reed, with said winding exhibiting a sharp maximum impedance peak at a frequency related to the natural frequency of vibration of said reed, and means connecting said winding between said base electrode and said point of reference potential, said winding providing a direct current path from said base electrode to said point of reference potential, said electromechanical device being frequency-selective for feeding energy from said second circuit to said first circuit of appropriate phase to sustain oscillations and being the sole frequency selective means in the oscillator circuit, whereby oscillations are sustained at the frequency of said maximum impedance peak of said winding.

References Cited in the file of this patent

UNITED STATES PATENTS 2,396,224 Artzt ------------------ Mar. 12, 1946

2,547,027 Winkler ---------------- Apr. 3, 1951
2,692,337 Hanson ---------------- Oct. 19, 1954

OTHER REFERENCES

Transistor Oscillators, RCA Review, Oser, Enders, and Moore, vol. XIII, No. 3, September 1952, pages 369–385.

Article: "Junction Transistor Equivalents Circuits and Vacuum-Tube Analogy," by Giacoletto, pages 1490–1493 of Proc. I. R. E., vol. 40, No. 11, for November 1952, Div. 51.